United States Patent
Fischer et al.

(10) Patent No.: US 9,928,995 B2
(45) Date of Patent: Mar. 27, 2018

(54) METHODS FOR PREVENTING PLASMA UN-CONFINEMENT EVENTS IN A PLASMA PROCESSING CHAMBER

(75) Inventors: Andreas Fischer, Castro Valley, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 905 days.

(21) Appl. No.: 12/820,020

(22) Filed: Jun. 21, 2010

(65) Prior Publication Data

US 2010/0251529 A1   Oct. 7, 2010

Related U.S. Application Data

(62) Division of application No. 11/537,515, filed on Sep. 29, 2006, now Pat. No. 7,740,736.

(60) Provisional application No. 60/804,278, filed on Jun. 8, 2006.

(51) Int. Cl.
*B23P 6/00* (2006.01)
*H01J 37/32* (2006.01)

(52) U.S. Cl.
CPC .. *H01J 37/32495* (2013.01); *H01J 37/32082* (2013.01); *H01J 37/32623* (2013.01); *Y10T 29/49718* (2015.01)

(58) Field of Classification Search
USPC ............ 216/67; 156/345.26, 345.44, 345.41, 156/345.42, 345.43, 345.45; 118/723 R, 118/723 E, 723 VE
See application file for complete search history.

(56) References Cited

U.S. PATENT DOCUMENTS

| | | | |
|---|---|---|---|
| 6,117,349 A * | 9/2000 | Huang et al. | 216/71 |
| 6,165,910 A | 12/2000 | Flanner et al. | |
| 6,432,261 B2 | 8/2002 | Watanabe et al. | |
| 6,485,604 B1 | 11/2002 | Okayama et al. | |
| 6,506,687 B1 | 1/2003 | Izawa et al. | |

(Continued)

FOREIGN PATENT DOCUMENTS

JP          10-140360          5/1998

OTHER PUBLICATIONS

"First Office Acton", Issued in Chinese Application No. 200780021251.6; dated Aug. 17, 2010.

(Continued)

*Primary Examiner* — Sylvia R MacArthur
(74) *Attorney, Agent, or Firm* — Martine Penilla Group, LLP

(57) ABSTRACT

A method for configuring a plasma processing chamber for preventing a plasma un-confinement event during processing of a substrate from occurring outside of a confined plasma sustaining region is provided. The confined plasma sustaining region is defined by a set of confinement rings surrounding a bottom portion of an electrode is provided. The method includes determining a worst-case Debye length for a plasma generated in the plasma processing chamber during the processing. The method also includes performing at least one of adjusting gaps between any pair of adjacent confinement rings and adding at least one additional confinement ring to ensure that a gap between the any pair of adjacent confinement rings is less than the worst-case Debye length.

7 Claims, 1 Drawing Sheet

(56) References Cited

U.S. PATENT DOCUMENTS

| | | |
|---|---|---|
| 6,554,949 B2 | 4/2003 | De et al. |
| 6,723,202 B2 | 4/2004 | Nagaiwa et al. |
| 6,823,815 B2 | 11/2004 | Han et al. |
| 6,899,786 B2 * | 5/2005 | Senzaki et al. .......... 156/345.43 |
| 2004/0129226 A1 | 7/2004 | Strang et al. |
| 2005/0039682 A1 | 2/2005 | Dhindsa et al. |
| 2005/0051517 A1 | 3/2005 | Oehrlein et al. |
| 2005/0099135 A1 | 5/2005 | Landis et al. |
| 2005/0103442 A1 * | 5/2005 | Chen et al. .............. 156/345.47 |
| 2005/0145336 A1 | 7/2005 | Matsushima et al. |
| 2006/0162657 A1 * | 7/2006 | Cirigliano .................... 118/715 |
| 2006/0283552 A1 * | 12/2006 | Rogers .................... 156/345.33 |
| 2007/0284045 A1 | 12/2007 | Fischer et al. |

OTHER PUBLICATIONS

"Written Opinion", Issue in PCT Application No. PCT/US2007/70758; dated Apr. 28, 2008.

"International Search Report", Issue in PCT Application No. PCT/US2007/70758; dated Apr. 28, 2008.

"Non Final Office Action", U.S. Appl. No. 11/537,515, dated Jan. 6, 2009.

"Non Final Office Action", U.S. Appl. No. 11/537,515, dated Apr. 24, 2008.

"Final Office Action", U.S. Appl. No. 11/537,515, dated Sep. 18, 2008.

"International Preliminary Report on Patentability", issued in PCT Application No. PCT/US2007/070758; dated Dec. 24, 2008.

"Final Office Action", U.S. Appl. No. 11/537,515, dated Mar. 4, 2009.

"Non Final Office Action", U.S. Appl. No. 11/537,515, dated Nov. 23, 2009.

Office Action from Chinese Patent Office for Chinese Patent Application No. 201010624669.X, dated Sep. 21, 2012 (6 pages).

* cited by examiner

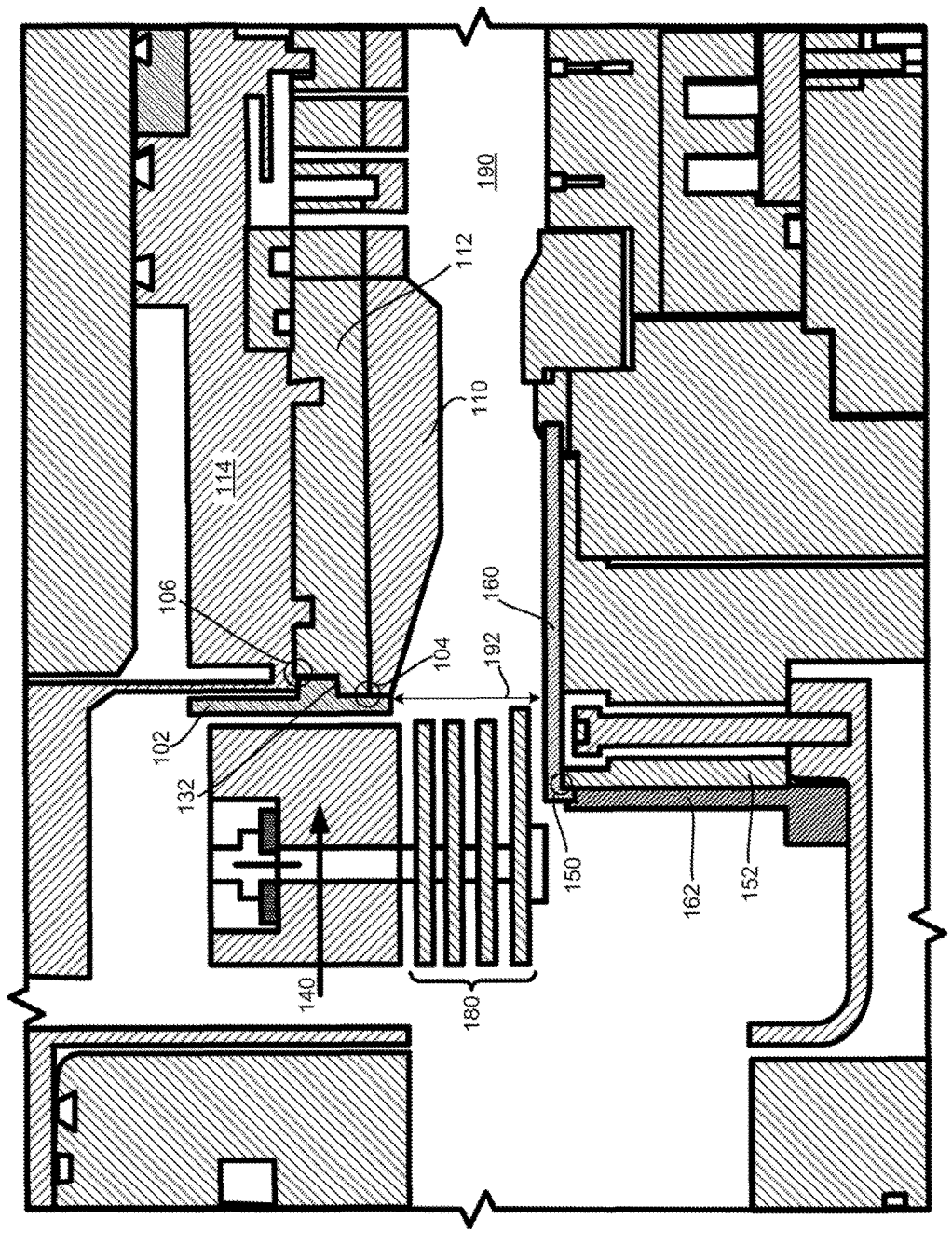

METHODS FOR PREVENTING PLASMA UN-CONFINEMENT EVENTS IN A PLASMA PROCESSING CHAMBER

PRIORITY CLAIM

This divisional application claims priority under 37 CFR 1.53(b) and claims the benefit under 35 U.S.C. § 120 to a commonly assigned patent application entitled "Methods and Apparatus for Preventing Plasma Un-confinement Events in a Plasma Processing Chamber," by Fischer et al., application Ser. No. 11/537,515 filed on Sep. 29, 2006, now U.S. Pat. No. 7,740,736, which claims priority under 35 USC 119(e) to a commonly-owned provisional application entitled "Methods and Apparatus for Preventing Plasma Un-confinement Events in a Plasma Processing Chamber", filed by the same inventors herein on Jun. 8, 2006 (Application No. 60/804,278), all of which are incorporated here by reference.

BACKGROUND

In the processing of a substrate, e.g., a semiconductor substrate or a glass panel such as one used in flat panel display manufacturing, plasma is often employed. As part of the processing of the substrate in a plasma chamber, the substrate is for example processed in a series of steps in which materials are selectively removed (etched) and deposited in order to form electrical components thereon.

In an example chamber implementation based on an Exelan™ plasma processing system platform (available from Lam Research Corporation of Fremont, Calif.), RF energy is employed to ignite and sustain the plasma within the intended plasma sustaining region, i.e., the region within the plasma processing chamber where plasma presence is intended for substrate processing purposes. During plasma processing, the return RF current may be conducted away from the plasma sustaining region via, for example, the upper electrode. The RF return current travels, in this example implementation, outside a confinement ring area across a chamber ceiling and a chamber liner traversing RF straps and a lower ground bucket back to an inner surface of a cantilever bore. Along this complicated path, the return RF current traverses several interfaces that join adjacent RF chamber components (or members).

As is typically the case for machined components, many of the RF chamber components have mating surfaces, interfaces, gaps or sharp edges due to machining or tolerance considerations. These sharp corners and surfaces themselves form gaps when adjacent RF chamber components are mated together, presenting high-impedance obstacles to the RF current.

Without wishing to be bound by theory, it is believed that in some cases, the high-impedance may cause a high voltage to be built up across a gap. If the voltage is built up sufficiently high, a spark or arc may result across the gap. Such arcing may, in many cases, cause charged particles such as electrons or ions to be ejected into the surrounding gas space(s). The gas space(s) surrounding many of these RF chamber components, while not disposed in the plasma generating region that is intended for generating and sustaining plasma during processing, may nevertheless be in a condition conducive to igniting and/or sustaining plasma during chamber operation. Accordingly, the unintended injection of charged particles may lead to the unwanted ignition of plasma in the gas space(s) surrounding these gaps even though these gas space(s) are not in the aforementioned intended plasma generating region (e.g., the region generally defined by the upper electrode, the lower electrode, and the surrounding confinement rings).

When one of these unwanted ignition events occurs, the plasma chamber is said to be suffering a plasma un-confinement event, which is a highly undesirable condition for the substrate processing environment, for the substrate currently being processed, and may lead to damage to chamber hardware components, particularly to the electrostatic chuck.

It should be noted that different RF chambers may have different components and or designs, and the RF current may take different paths in different chambers. Irrespective of the particulars of the different RF chambers, the RF current in many chambers tend to traverse multiple RF chamber components and tend to sporadically suffer from similar gap-related arcing and unwanted plasma ignition problems.

SUMMARY OF INVENTION

The invention relates, in an embodiment, to a plasma processing system having a plasma processing chamber configured for processing substrates. The plasma processing system includes a plurality of components, at least two components of the plurality of components being disposed adjacent to each other in a mating configuration such that there exists a gap between the two components. The gap is disposed along a RF current path during the processing. There is also included a dielectric shielding structure configured to shield at least a portion of the gap from surrounding gas spaces in the plasma processing chamber during the processing.

In another embodiment, the invention relates to a plasma processing system having a plasma processing chamber configured for processing substrates. The plasma processing system includes a plurality of components, at least one of the component having a sharp component structure disposed along a RF current path during the processing. There is also included a dielectric shielding structure configured to shield at least a portion of the sharp component structure from surrounding gas spaces in the plasma processing chamber during the processing.

In another embodiment, the invention relates to a method for configuring a plasma processing chamber for processing substrates, the plasma processing chamber having therein a plurality of confinement rings. The method includes determining a worst case Debye length for a plasma generated in the plasma processing chamber during the processing. The method further includes performing at least one of adjusting gaps between individual ones of the plurality of confinement rings and adding at least one additional confinement ring to ensure that a gap between any pair of adjacent confinement rings is greater than the worst-case Debye length.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figure(s) of the accompanying drawing(s) and in which like reference numerals refer to similar elements and in which:

FIG. 1 shows, in accordance with one or more embodiments of the present invention, cross-sectional views of dielectric covers and confinement rings disposed in an outer region of a plasma processing chamber.

DETAILED DESCRIPTION

The present invention will now be described in detail with reference to a few embodiments thereof as illustrated in the accompanying drawing(s). In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described.

In embodiments of the present invention, there are provided techniques and apparatus for substantially reducing and/or preventing the occurrence of plasma un-confinement events. As discussed, it is believed that aspects of the plasma chamber design and/or construction may contribute to the occurrence of arcing, leading to the unwanted ignition of plasma outside of the intended plasma sustaining region. As mentioned earlier, the inventors herein believe that gaps between mating surfaces of adjacent chamber components represent a factor contributing to arcing when the gaps are disposed along the RF current path (such as, for example, the return RF current path). The sparks present during arcing represent unintended injection of charges or energy that can result in the generation and/or ejection of charged particles into the surrounding gas space(s).

Another factor contributing to unwanted plasma ignition is believed to be the presence of sharp chamber component edges or corners along the RF current path. These sharp geometries tend to focus the electric field, leading in some instances to the unintended generation of charged particles in the surrounding gas spaces.

It is also believed that sporadic un-confinement plasma events may also be caused by transient instability events that lead to surges in the plasma density. These plasma density surges may have a variety of causes, such as for example RF generator surges. Irrespective of the reason for these transient instabilities in the plasma density, it is believed that plasma confinement may be improved by properly configuring and/or reducing the spacing between adjacent plasma confinement rings.

Embodiments of the invention aim to address one or more of the aforementioned causes of plasma un-confinement. To address the arc-related unwanted plasma ignition, there is provided, in accordance with an embodiment of the invention, a dielectric shielding structure (such as a cover or sleeve) that shields gaps between adjacent chamber components from the surrounding gas space(s) when these gaps are disposed along the RF current path. Generally speaking, one or more sleeves or covers may be provided as necessary to provide the shielding function. With reference to FIG. 1 which shows the relevant portion of an example plasma processing chamber, there is shown a dielectric sleeve 102, which shields gap 104 and gap 106 in the example chamber implementation from the immediately surrounding gas space(s) that are adjacent to gap 104 and gap 106. In the example implementation of FIG. 1, gap 104 exists at the interface between outer electrode 110 (which maybe formed of, for example, silicon) and mounting plate 112. Even though the outer electrode 110 and mounting plate 112 may be mated together (via elastomer bonding, for example), a small gap still exists in between adjacent mating surfaces. Likewise, gap 106 exists between mounting plate 112 and upper chamber structure 114 (which may be formed of, for example, aluminum).

It is believed that as the RF current travels along the skin or surface of chamber components, a gap such as gap 104 presents a high-impedance obstacle to the RF current, leading to the build up of a potential difference across the gap and, at some point, to an electrical discharge that is characterized by arcing.

Sleeve 102 may be formed of a dielectric material (such as an inorganic insulator material) and shields the gaps from the immediately surrounding gas spaces. In this manner, even if arcing occurs across gap 104 and/or gap 106, the sparks generated during arcing are shielded from the surrounding gas space(s), thereby preventing the unwanted generation and/or ejection of charged particles and/or unwanted ignition of plasma in the surrounding gas spaces.

In an embodiment, sleeve 102 is formed of quartz although other suitable dielectric materials such as alumina (e.g., aluminum oxide), silicon nitride, etc., may also be employed. As long as sleeve 102 is substantially non-conducting, sleeve 102 may be made of any material that is compatible with the plasma process being practiced in the RF chamber. Although a single sleeve is shown in FIG. 1, multiple sleeves and/or covers are possible. Furthermore, dielectric covers the shields RF-active gaps from the surrounding gas spaces may have geometric shapes other than sleeves.

Sleeve 102 is shown with a shelf 132, which is captured between mounting plate 112 and upper chamber structure 114 when mounting plate 112 is fastened (e.g., bolted) to upper chamber structure 114. During assembly, sleeve 102 may be placed around the outer electrode 110/mouting plate 112 structure such that shelf 132 rests on the shoulder formed in mounting plate 112. The structure that includes outer electrode 110, mounting plate 112, and sleeve 102 may then be fastened to upper chamber structure 114, causing sleeve 102 to be captured between mounting plate 112 and upper chamber structure 114. From the direction shown by reference arrow 140, no exposed portion of a fastener structure (such as screw holes or screw heads) would be present in sleeve 102, reducing the likelihood of contamination trapping and/or eliminating the presence of sharp structures (such as screw heads) that may cause spark generation during plasma processing. The point is that sleeve 102 (and covers that are provided to shield gaps between RF active interfaces from the surrounding gas spaces) should be constructed such that when installed in the chamber, these sleeves and covers do not contribute to arcing themselves.

As mentioned, sharp component structures (edges or corners) along the RF current path may have the effect of concentrating the electric field, leading to the unwanted generation of charged particles and/or the unwanted ignition of plasma in the surrounding gas spaces. As the term is employed herein, a sharp component structure represents a component or a junction between components having a shape that is characterized by its heightened ability, relative to other component structures, to concentrate the electric field such that unwanted generation of charged particles and/or unwanted ignition of plasma in the surrounding gas spaces may occur. With reference to FIG. 1, sharp corner 150 of a ground bucket 152 may concentrate the electric field such that unwanted generation of charged particles and/or unwanted ignition of plasma in the surrounding gas spaces may occur. Note that this is a different un-confinement plasma ignition mechanism from the aforementioned RF active gaps since there are no gaps at corner 150.

In an embodiment of the invention, a dielectric corner-draping cover formed of a dielectric material (such as a non-conductive insulator material) is provided to shield the sharp component structure from the surrounding gas space. This corner-draping cover is shown in the example of FIG. 1 by a corner-draping cover 160. Corner-draping cover 160 includes a lip that extends vertically downward in FIG. 1 and drapes over corner 150 so as to present a continuous dielectric shield for corner 150. In an embodiment, corner-draping cover 160 is formed of quartz although other suitable dielectric materials such as alumina (e.g., aluminum oxide), silicon nitride, etc., may also be employed. As long as corner-draping cover 160 is substantially non-conducting, corner-draping cover 160 may be made of any material that is compatible with the plasma process being practiced in the RF chamber.

Note that it is not necessary for corner-draping cover 160 to be formed of a single piece of material to cover all RF active surfaces of ground bucket 152. In the example of FIG. 1, since the vertical side of the ground bucket is not exposed to the plasma in an intended plasma sustaining region 190, the vertical side of ground bucket 152 may be shielded using another cover formed of a different or the same dielectric material, if desired. The provision of a lip and/or the overlapping of the two covers allows the use of multi-piece (e.g., two) covers, which lowers the manufacturing cost since a bulky and complexly-shaped cover is not required. In an example implementation, the vertical side of ground bucket 152 is covered using a cover 162, which may be formed of, for example a plastic material such as amorphous thermoplastic polyetherimide (commonly known by the name Ultem). As long as cover 162 is substantially non-conducting, cover 162 may be made of any material that is compatible with the plasma process being practiced in the RF chamber and/or with the condition that exists along the vertical sidewall of the ground bucket during plasma processing. Cover 162 and corner-draping cover 160 may overlap as shown in FIG. 1 to provide complete coverage for the RF active corner and/or RF active surfaces of ground bucket 152.

As mentioned, it is believed by the inventors herein that sporadic un-confinement plasma events may also be caused by transient instability events that lead to surges in the plasma density. Further, irrespective of the reason for these transient instabilities in the plasma density, it is believed that plasma confinement may be improved by the proper spacing between adjacent plasma confinement rings.

Generally speaking, decreasing the spacing between adjacent plasma confinement rings (which may require in some cases retrofitting existing chambers with additional confinement rings) allows a set of confinement rings 180 to confine the plasma within intended plasma sustaining region 190 even in the event of plasma density surging. While not wishing to be bound by theory, it is believed that, for example, a decrease by a factor of two in the adjacent confinement rings spacing may allow the set of confinement rings to satisfactorily confine the plasma even if the instantaneous plasma density surges by up to a factor of four. By empirically determining the optimal spacing between adjacent confinement rings, the occurrence of sporadic plasma un-confinement events may be substantially reduced and/or eliminated.

In an embodiment, the spacing between adjacent plasma confinement rings (denoted by the variable S) is dimensioned such that $$S < DL_{(WC)} \qquad \text{Equation 1.}$$

In equation 1, $DL_{(WC)}$ represents the worst case Debye length of the plasma, i.e., the Debye length of the plasma in the worst case plasma density surge. Although a given plasma may be quantified in different ways, Debye length is one of the more well-known approaches for quantifying a plasma and may be calculated for any plasma. Further information regarding Debye length may be found in many plasma reference texts, including for example Introduction to Plasma Physics. Goldston & Rutherford (1997), Institute of Physics Publishing, Philadelphia, Pa., which is incorporated herein by reference.

By empirically or theoretically determining the worst case plasma density for a given plasma processing chamber (or even through educated guessing), the Debye length may be derived, which may then be used in equation to determine the desired spacing between adjacent plasma confinement rings. The decrease in the adjacent confinement rings spacing should, in an embodiment, be balanced against the need to satisfactorily exhaust byproduct gases from intended plasma sustaining region 190. Spacings that are too tight may unduly impede the removal of byproduct gases, thereby negatively impacting the substrate processing. If, for example, chamber gap 192 allows, additional confinement rings with corresponding inter-ring gaps may be introduced in order to pick up the exhaust flow of byproducts. The optimal adjacent confinement rings spacing represents, in an embodiment, the distance that substantially reduces or eliminates the occurrences of plasma un-confinement events without unduly impacting the requirement to satisfactorily exhaust byproduct gases from the plasma processing chamber. The number of confinement rings may be configured accordingly.

As can be appreciated by the foregoing, embodiments of the present invention may advantageously reduce and/or prevent the occurrence of plasma un-confinement events. By shielding a surface, gap, or corner of one or more components with a dielectric shielding structure, one or more embodiments may reduce and/or prevent unintended charged articles from entering into gas space(s) surrounding the one or more components. By reducing spacing(s) between plasma confinement rings, one or more embodiments may improve plasma confinement against surges in plasma density. As a result, plasma processing may be more stable and/or better controlled.

It should be noted that any combination of one, two, or all three of the aforementioned techniques (i.e., gap covering, corner-draping covering, and adjacent confinement rings spacing decrease) may be employed in a given plasma processing chamber. Also, although specific chamber components are illustrated to facilitate discussion, it should be understood that these techniques can be adapted, either singly or in combination, to shield, without limitation, any RF active gap or corner or edge or protrusion that may contribute to the occurrences of plasma un-confinement events. Further, it should be noted that although the invention is illustrated using the Exelan™ platform, embodiments of the invention are applicable to any type of plasma processing chambers, including capacitively coupled chambers, inductively coupled chambers, microwave chambers, etc.

While this invention has been described in terms of several embodiments, there are alterations, permutations, and equivalents, which fall within the scope of this invention. For example, although FIG. 1 discusses dielectric covers for shielding gaps and corners, other means such as dielectric coating may also be employed. It should also be noted that there are many alternative ways of implementing the methods and apparatuses of the present invention. It is therefore intended that the specification be interpreted as including all such alterations, permutations, and equivalents as fall within the true spirit and scope of the present invention.

What is claimed is:

1. A method for configuring a plasma processing chamber for preventing a plasma un-confinement event, during processing of a substrate, from occurring outside of a confined plasma sustaining region, wherein said confined plasma sustaining region is defined by a set of confinement rings disposed at a chamber gap that surrounds a bottom portion of an electrode, said method comprising:
   determining a worst case Debye length for a plasma generated in said plasma processing chamber during said processing; and
   performing at least one of adjusting gaps between any pair of adjacent confinement rings and adding at least one additional confinement ring, the performing includes,
      determining that a gap provided between any pair of said adjacent confinement rings is less than the worst-case Debye length that was determined for plasma generated in said processing chamber so as to substantially prevent the plasma un-confinement event from occurring, and
      adjusting the gap such that the gap provides a path for exhaustion of byproduct gases from the plasma sustaining region, and the gap does not allow sealing the path for exhaustion of the byproduct gases,
   wherein said worst-case Debye length is determined empirically.

2. The method of claim 1 wherein said performing represents both of said adjusting said gaps and said adding said at least one additional confinement ring.

3. The method of claim 1 wherein said performing represents said adjusting said gaps without said adding said at least one additional confinement ring.

4. The method of claim 1 wherein said performing represents said adding at least one additional confinement ring without said adjusting said gaps.

5. The method of claim 1 further comprising:
   identifying a condition conducive for igniting a plasma outside said confined plasma sustain region, wherein said condition occurs along a radio frequency (RF) current path; and
   employing a dielectric shielding structure for shielding at least a portion of said condition from surrounding gas spaces.

6. A method for configuring a plasma processing chamber for preventing a plasma un-confinement event, during processing of a substrate, from occurring outside of a confined plasma sustaining region, wherein said confined plasma sustaining region is defined by a set of confinement rings disposed at a chamber gap that surrounds a bottom portion of an electrode, said method comprising:
   determining a worst case Debye length for a plasma generated in said plasma processing chamber during said processing; and
   performing at least one of adjusting gaps between any pair of adjacent confinement rings and adding at least one additional confinement ring, the performing includes,
      determining that a gap provided between any pair of said adjacent confinement rings is less than the worst-case Debye length that was determined for the plasma generated in said plasma processing chamber so as to substantially prevent the plasma un-confinement event from occurring,
      adjusting the gap such that the gap provides a path for exhaustion of byproduct gases from the plasma sustaining region, and the gap does not allow sealing the path for exhaustion of the byproduct gases;
   identifying a gap between mating surfaces of adjacent chamber components, said gap being disposed along a radio frequency (RF) current path; and
   employing a dielectric shielding structure for shielding at least a portion of said gap from surrounding gas spaces in said plasma processing chamber during said processing.

7. A method for configuring a plasma processing chamber for preventing a plasma un-confinement event during processing of a substrate from occurring outside of a confined plasma sustaining region, wherein said confined plasma sustaining region is defined by a set of confinement rings disposed at a chamber gap that surrounds a bottom portion of an electrode, said method comprising:
   determining a worst case Debye length for a plasma generated in said plasma processing chamber during said processing; and
   performing at least one of adjusting gaps between any pair of adjacent confinement rings and adding at least one additional confinement ring, the performing includes,
      determining that a gap provided between any pair of said adjacent confinement rings is less than the worst-case Debye length that was determined for the plasma generated in said plasma processing chamber so as to substantially prevent the plasma un-confinement event from occurring, and
      adjusting the gap such that the gap provides a path for exhaustion of byproduct gases from the plasma sustaining region, and the gap does not allow sealing the path for exhaustion of the byproduct gases;
   identifying a chamber component with a sharp component structure along a radio frequency (RF) current path; and
   employing a dielectric shielding structure for shielding at least a portion of said sharp component structure from surrounding gas spaces in said plasma processing chamber during said processing.

* * * * *